United States Patent
Wang et al.

(10) Patent No.: US 10,025,512 B2
(45) Date of Patent: Jul. 17, 2018

(54) DISTRIBUTED STORAGE DATA RECOVERY

(71) Applicant: Hewlett Packard Enterprise Development LP, Houston, TX (US)

(72) Inventors: Han Wang, Houston, TX (US); Joseph E. Foster, Houston, TX (US); Patrick A. Raymond, Houston, TX (US); Raghavan V. Venugopal, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/305,517

(22) PCT Filed: Jun. 17, 2014

(86) PCT No.: PCT/US2014/042802
§ 371 (c)(1),
(2) Date: Oct. 20, 2016

(87) PCT Pub. No.: WO2015/195104
PCT Pub. Date: Dec. 23, 2015

(65) Prior Publication Data
US 2017/0046226 A1    Feb. 16, 2017

(51) Int. Cl.
*G06F 3/06* (2006.01)
*G06F 11/10* (2006.01)
*H03M 13/00* (2006.01)

(52) U.S. Cl.
CPC ............ *G06F 3/0619* (2013.01); *G06F 3/064* (2013.01); *G06F 3/067* (2013.01);
(Continued)

(58) Field of Classification Search
CPC . G06F 3/0619; G06F 11/1076; H03M 13/616
See application file for complete search history.

(56) References Cited

U.S. PATENT DOCUMENTS 4,358,848 A * 11/1982 Patel .................. G06F 11/1028
714/761
7,296,180 B1    11/2007 Waterhouse et al.
(Continued)

FOREIGN PATENT DOCUMENTS

WO    WO-2005122630 A2    12/2005

OTHER PUBLICATIONS

Blomer et al., "An XOR-based erasure-resilient coding scheme.", Aug. 1995, Technical Report TR-95-048, International Computer Science Institute, <http://cs.uni-paderborn.de/fileadmin/informatik/fg/cuk/Forschung/Publikationen/erasure.pdf>.
(Continued)

*Primary Examiner* — Joseph D Torres
(74) *Attorney, Agent, or Firm* — Hewlett Packard Enterprise Patent Department

(57) ABSTRACT

Processing data in a distributed data storage system generates a sparse check matrix correlating data elements to data syndromes. The system receives notification of a failed node in the distributed data storage system, accesses the sparse check matrix, and determines from the sparse check matrix a correlation between a data element and a syndrome. The system processes a logical operation on the data element and the syndrome and recovers the failed node.

20 Claims, 14 Drawing Sheets

(52) U.S. Cl.
CPC ...... *G06F 11/1076* (2013.01); *G06F 11/1088* (2013.01); *H03M 13/616* (2013.01)

(56) References Cited

U.S. PATENT DOCUMENTS

| | | | |
|---|---|---|---|
| 7,472,334 | B1 | 12/2008 | Scott et al. |
| 7,734,643 | B1 | 6/2010 | Waterhouse et al. |
| 2012/0173932 | A1 | 7/2012 | Li et al. |
| 2013/0124776 | A1 | 5/2013 | Hallak et al. |
| 2013/0205181 | A1 | 8/2013 | Blaum et al. |
| 2015/0254008 | A1* | 9/2015 | Tal ........................ G06F 3/0619 711/114 |

OTHER PUBLICATIONS

James S. Plank, "Optimizing Cauchy Reed-Solomon Codes for Fault-Tolerant Storage Applications", Technical Report CS-05-569, Department of Computer Science, University of Tennessee, Dec. 2005.<http://citeseerx.ist.psu.edu/viewdoc/download?doi=10.1.1.110.8887&rep=rep1&type=pdf>.

Robin Harris, "Cleversafe's dispersed storage network," Mar. 3, 2008, StorageMojo, <https://storagemojo.com/2008/03/03/cleversafes-dispersed-storage-network/>.

Wikipedia, "Decoding methods," May 7, 2014, <https://en.wikipedia.org/w/index.php?title=Decoding_methods&oldid=607494394>.

Wikipedia, "Parity-check matrix" Apr. 3, 2014, <https://en.wikipedia.org/w/index.php?title=Parity-check_matrix&oldid=602623919>.

Wikipedia, "Reed-Solomon error correction," Mar. 12, 2014, <https://en.wikipedia.org/w/index.php?title=Reed%E2%80%93Solomon_error_correction&oldid=599354206>.

Greenan, K.M. et al., Flat XOR-based erasure codes in storage systems: Constructions efficient recovery, and tradeoffs, (Research Paper), Apr. 8, 2010, 14 pages.

ISR/WO, PCT/US2014/042802, HP reference 83959649, Feb. 24, 2015, 10 pages.

Phutathum, P. Implementing Distributed Storage Systems by Network Coding and Considering Complexity of Decoding, Aug. 20, 2012, 58 pages.

Sathiamoorthy, M. et al., XORing Elephants: Novel Erasure Codes for Big Data, (Research Paper), Aug. 26-30, 2013, 12 pages.

* cited by examiner

DISTRIBUTED STORAGE DATA RECOVERY

BACKGROUND

Mobile services, social networking, online services, cloud services, and other data services are generating and accumulating large amounts of data, sometimes known as "big data." Disk storage systems ranging from locally resilient disk array infrastructures to globally distributed and resilient storage infrastructures may be employed to store, retrieve, and recover data.

DETAILED DESCRIPTION

Figure 1:
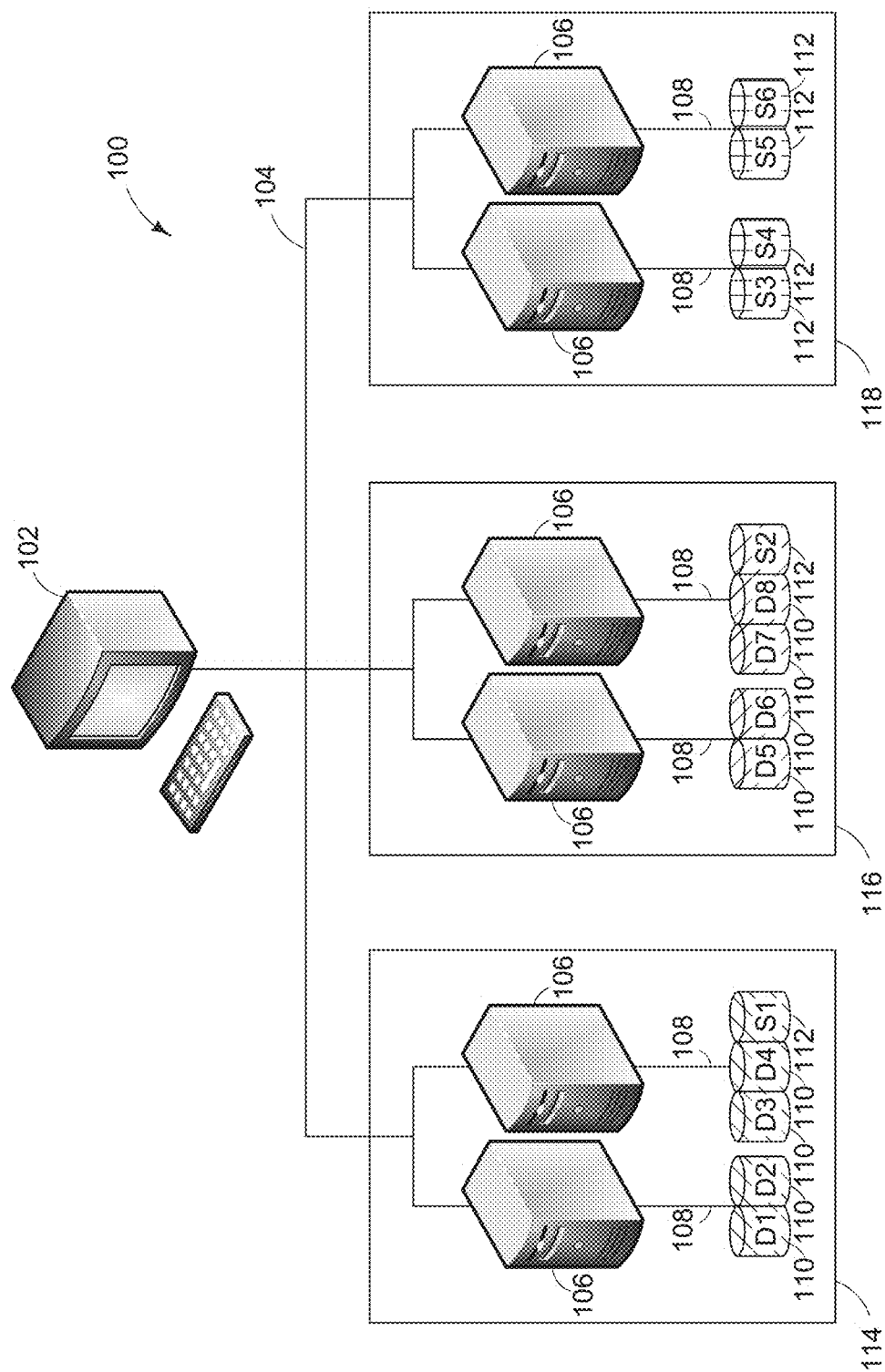
FIG. 1 illustrates a block diagram of a distributed data storage system, according to an example of the present disclosure.

FIG. 1 illustrates a block diagram of a distributed data storage system 100, according to an example of the present disclosure. The distributed data storage system 100, in an example, may utilize erasure coding for purposes of storage efficiency.

In an example, computer 102 may be a management computer, server, or other device running management software or a disk management module to manage or configure the distributed data storage system 100. In an example, computer 102 may create, store, or manage a data matrix for use in the distributed data storage system 100, as discussed in more detail herein with respect to FIG. 2. In another example, management software or a disk management module and a data matrix for use in the distributed data storage system 100 may be stored on, e.g., one or more servers 106.

In an example, distributed data storage system 100 may comprise more than one fault zone, data zone, or data center, such as data centers or data stores 114, 116, and 118. In an example, a fault zone may comprise one or more disk drives, servers, data centers, or a collection of data that may be recovered. The data centers may be geographically co-located, or may be in different geographical locations, such as in different rooms, buildings, cities, states, or countries. In an example, data center 114 may be in New York, data center 116 may be in Texas, and data center 118 may be in California.

Each data center in distributed data storage system 100, e.g., data centers 114, 116, and 118, may comprise at least one computer, server, host, or other device 106 to process and/or store data. In an example, data may be stored on a disk drive, e.g., disk drives 110 and 112 (hereinafter "nodes"). Nodes 110 and 112 may comprise any storage technology, e.g., the nodes may be an HDD, SSD, persistent memory, other storage technology, or combination thereof, and may be connected directly to or internal to servers 106, or may be external to servers 106.

Computer 102, servers 106, nodes 110 and 112, and data centers 114, 116, and 118 of distributed data storage system 100 may communicate or be interconnected by a network, such as a local area network (LAN), a wide area network (WAN), a storage area network (SAN), the Internet, or any other type of communication link, e.g., network 104. In addition, distributed data storage system 100 and/or network 104 may include system buses or other fast interconnects or direct connections, e.g., direct connections 108 between servers 106 and nodes 110 and 112.

As discussed in more detail below, data stored on drives, e.g., nodes 110 and 112, may comprise a data element (or "data container") and/or a syndrome. As also discussed below in more detail, data elements and syndromes may be stored within the same data center, or may be stored in different data centers. For example, in FIG. 1, data center 114 stores four data elements D1-D4 (110) and a syndrome S1 (112). Data center 116 stores four data elements D5-D8 (110) and a syndrome S2 (112). Data center 118 stores no data elements, and four syndromes, S3-S6 (112).

Figure 2:
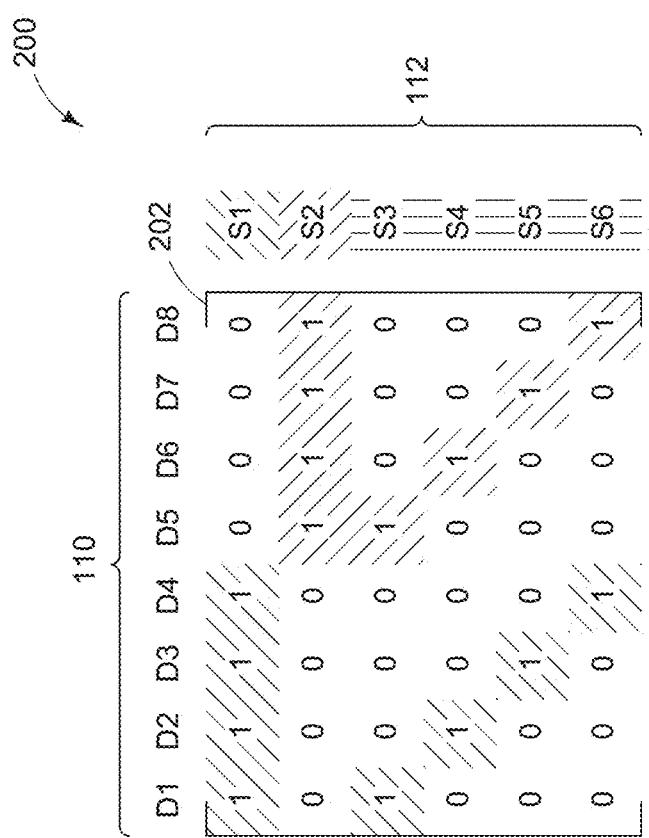
FIG. 2 illustrates a data matrix, according to an example of the present disclosure.

FIG. 2 illustrates a data matrix, according to an example of the present disclosure. More specifically, FIG. 2 illustrates a sparse check matrix 202. In an example, the sparse check matrix 202 may be a matrix of data elements, e.g., D1 through D8 (110), and syndromes, e.g., S1-S6 (112), with a very sparse or "non-dense" arrangement. In some examples, a sparser matrix may result in a stronger capability to locally recover upon a single erasure. For example, in the sparse check matrix 202 of FIG. 2, only a small number of nodes may be required to recover an erasure iteratively. In some examples, the sparse check matrix may include permutations, linear and non-linear transformation to denser or sparser matrices, and/or non-binary matrices.

Sparse check matrix 202 also illustrates an example of data, e.g., a file "D", split into eight separate data elements or containers D1-D8 which may be stored on, e.g., nodes 110. For example, a file of eight gigabytes in size, e.g., file D, may be split into eight separate one gigabyte data elements D1-D8 (110), as discussed in more detail below.

Sparse check matrix 202 also illustrates an example of six syndromes, S1-S6, which may be stored on, e.g., nodes 112, that correlate to data elements D1-D8 which may be stored on, e.g., nodes 110. In an example, a syndrome may be a digit, identifier, flag, or other calculated value used to check for errors and/or the consistency of data, and regenerate data if necessary. A syndrome may be contrasted with, in sonic examples, a checksum, which may provide for error detection but not regeneration of data. In some examples, e.g., when using a protection scheme such as RAID 6 or RAID MANY, a syndrome may represent a syndrome block where the syndrome represents more than a single bit. In some examples, the syndrome block may be a byte, a redundancy block, or another value to support various levels of RAID or larger sparse check matrix sizes.

In the example of FIG. 2, syndromes S1-S6 may be calculated based on data elements D1-D8. In an example, a digit 1 in any given column is an indicator that the data is used in the calculation of the syndrome associated with the data in that row. For example, syndrome S3 may be calculated from data elements D1 and D5, while syndrome S4 may be calculated from data elements D2 and D6. The sparse check matrix 202 of FIG. 2 also illustrates, through the use of shading, an example of geographically distributing data and syndromes across data centers, as is also illustrated in FIG. 1.

Sparse check matrix 202 also illustrates strong local recovery capability, with data elements that can be co-located in, e.g., a single data center. More specifically, in a sparse check matrix, fewer nodes may be correlated to a single syndrome, reducing the pressure on a network for accessing remaining good data.

Figure 3:
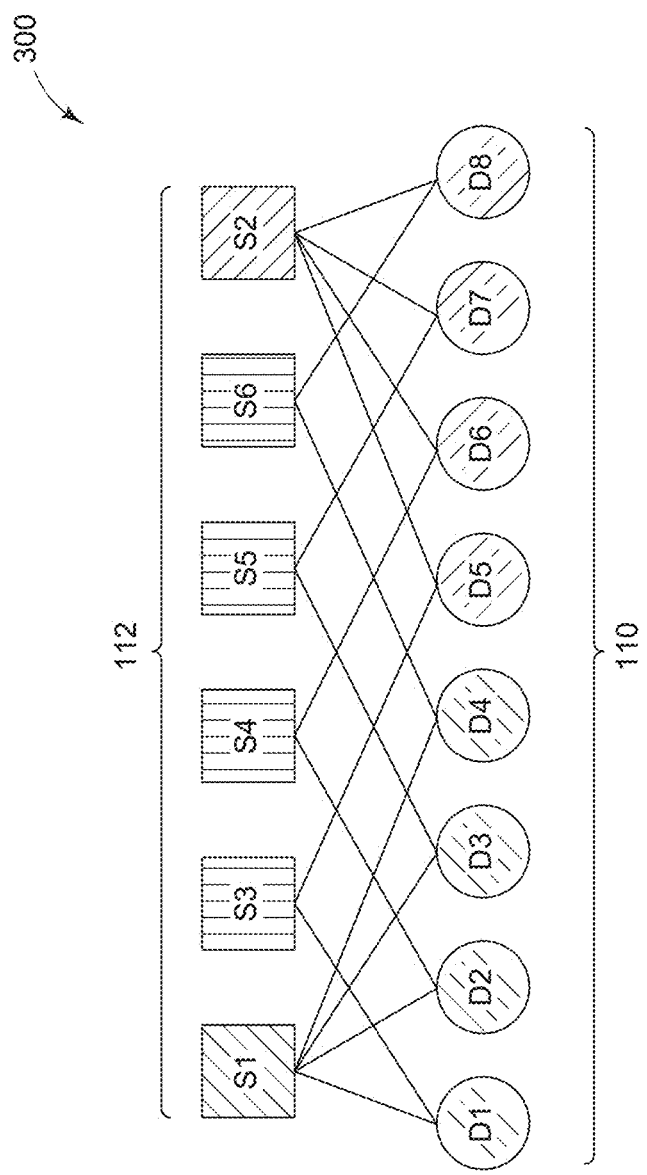
FIG. 3 illustrates correlations between data elements and syndromes in a data matrix, according to an example of the present disclosure.

FIG. 3 illustrates correlations between data and syndromes in a data matrix, according to an example of the present disclosure. More specifically, FIG. 3 illustrates a correlated view of the sparse check matrix 202 of FIG. 2. As above, for example, syndrome S3 may be calculated from D1 and D5, while syndrome S4 may be calculated from D2 and D6.

Figure 4:
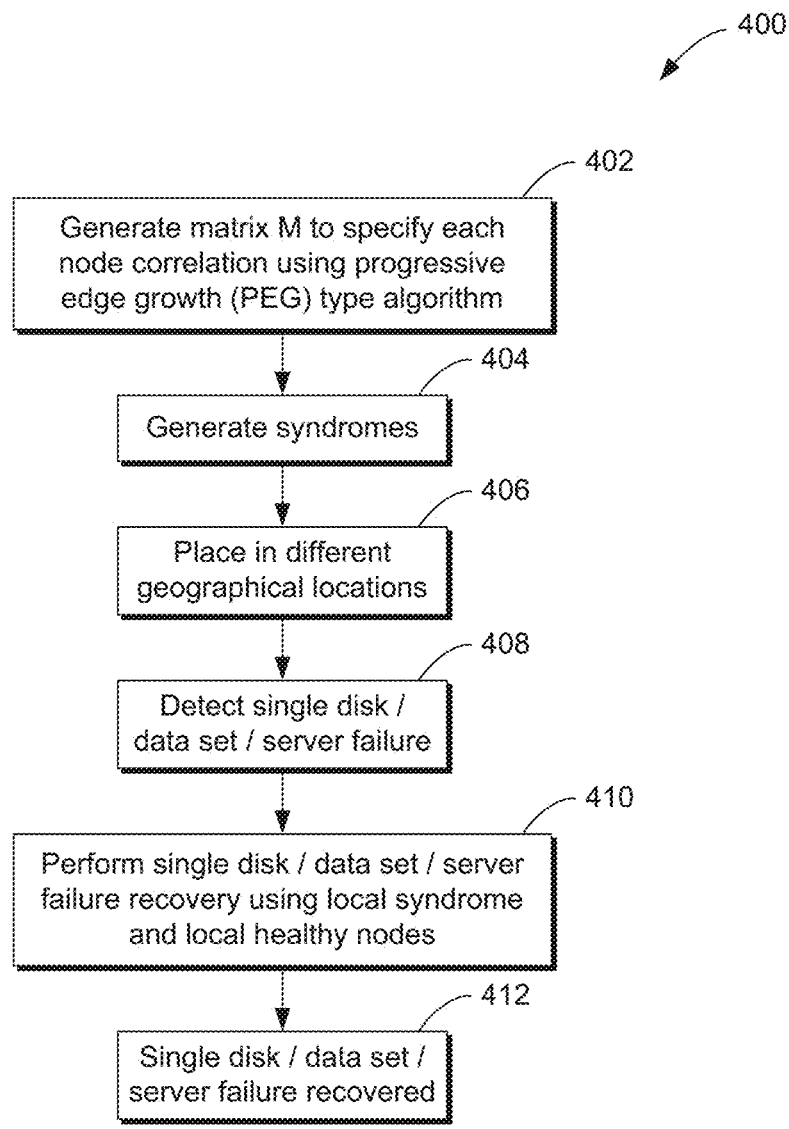
FIG. 4 illustrates a flow diagram of data recovery in a single point of failure example of the present disclosure.

FIG. 4 illustrates a flow diagram of data recovery in a single point of failure example of the present disclosure. In block 402, in an example, a matrix, e.g., sparse check matrix 202, is generated prior to detection of a failure. The matrix may be generated using an algorithm such as, e.g., a progressive edge growth (PEG) algorithm.

In block 404, syndromes, e.g., S1-S6 of FIG. 2, are generated. As discussed above, syndromes S1-S6 may be calculated based on data elements D1-D8 in the sparse check matrix 202.

In block 406, data elements D1-D8 and syndromes S1-S6 may be stored, e.g., in one or more data centers such as data center 114, data center 116, and/or data center 118. In an example, data elements D1-D8 and syndromes S1-S6 may be dispersed across data centers randomly or based on one or more criteria, such as geographic dispersion or geographic biasing.

In block 408, which may comprise monitoring within a distributed data storage system, a single failure is detected, i.e., a failure notification is received. In various examples, a single failure may include but not be limited to the failure of a node, the failure of a drive, the failure of a data set, the failure of an array, and/or the failure of a server. A single failure may be detected by, for example, a drive subsystem, a server, a data center, an adjacent server, an adjacent data center, a scanning tool, a management computer such as computer 102 of FIG. 1, a disk management module, or another mechanism for monitoring drive performance, health, or uptime.

In block 410, after a single failure has been detected, in an example, the failed node is recovered by accessing the sparse check matrix 202, determining a correlated syndrome for the failed node, and recovering the single failure from within the same data center through, e.g., a recursive process. The recovery may be performed on, for example, the server with a failure, another server, a data center tool, or a management tool, e.g., computer 102 of FIG. 1. The recovery of the single node is discussed in more detail with respect to FIGS. 7-9 below.

In block 412, the single node is fully recovered and a report or alert may be generated by, e.g., the server, another server, a data center tool, a disk management module, or a management tool.

Figure 5:
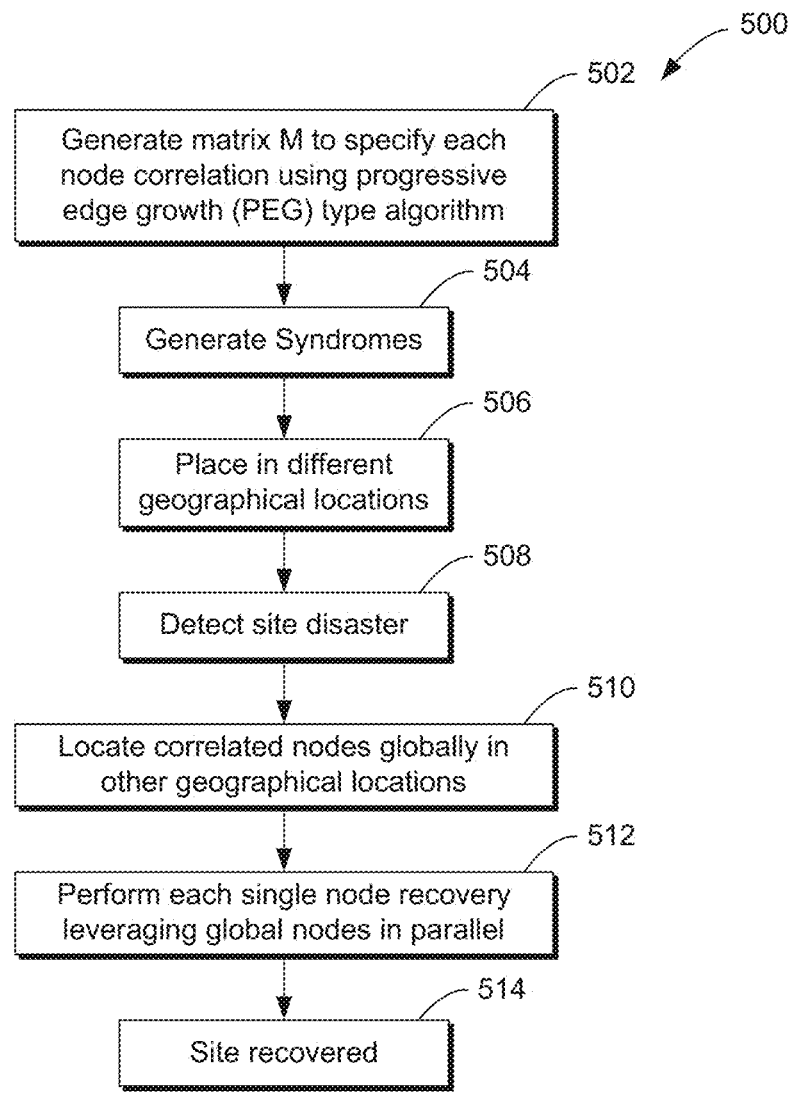
FIG. 5 illustrates a flow diagram of data recovery in a multiple point of failure example of the present disclosure.

FIG. 5 illustrates a flow diagram of data recovery in a multiple point of failure example of the present disclosure.

In block 502, in an example, a matrix, e.g., sparse check matrix 202, is generated, as in the example of FIG. 4 and block 402. The matrix may be generated using an algorithm such as, e.g., a progressive edge growth (PEG) algorithm. As in block 404, syndromes, e.g., S1-S6 of FIG. 2, are generated in block 504, and may be calculated based on data elements D1-D8 in the sparse check matrix 202.

Also as in block 406, in block 506, data elements D1-D8 and syndromes S1-S6 may be stored, e.g., in one or more data centers such as data center 114, data center 116, and/or data center 118, and may be dispersed across data centers randomly or based on one or more criteria.

In block 508, a failure of more than one node, such as a site disaster, is monitored and/or detected, and/or a notification is received. In various examples, a failure of multiple nodes may include but not be limited to the failure of more than one node, more than one drive, more than one data set, more than one array, and/or more than one server. In an example, a failure of more than one node may affect an entire data center, e.g., all of data center 114 going offline. A failure of more than one node may be detected by, for example, a drive subsystem, a server, a data center, an adjacent server, an adjacent data center, a scanning tool, a disk management module, a management computer such as computer 102 of FIG. 1, or another mechanism for monitoring drive performance, health, or uptime.

In block 510, after a failure of more than one node has been detected, in an example, the failed nodes are recovered by accessing the sparse check matrix 202, determining correlated syndromes for the failed nodes across other geographical locations, e.g., data centers 114, 116, and 118, and recovering the failed data elements globally through, e.g., a recursive process. The recovery may be performed on, for example, an affected server, another server, a data center tool, a disk management module, or a management tool, e.g., computer 102 of FIG. 1. The recovery of multiple nodes is discussed in more detail with respect to FIGS. 11-13 below.

Figure 6:
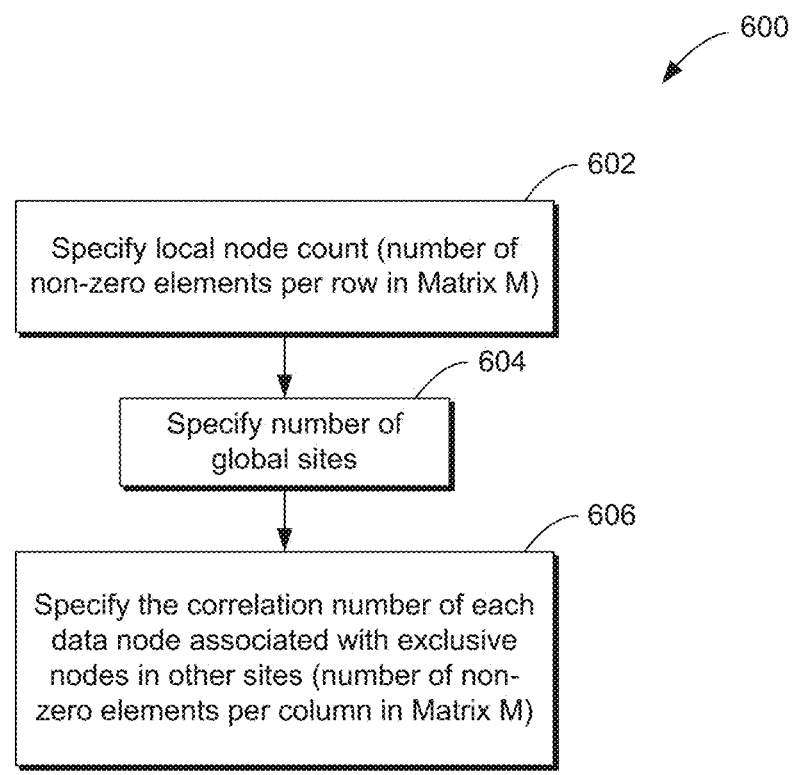
FIG. 6 illustrates a flow diagram of correlating nodes, according to an example of the present disclosure.

FIG. 6 illustrates a flow diagram of correlating nodes, according to an example of the present disclosure. More specifically, FIG. 6 illustrates a breakdown of the inputs to block 502 of FIG. 5 wherein, in an example, a matrix, e.g., sparse check matrix 202, is generated.

In block 602, in an example, the local node count, e.g., the number of non-zero elements per row in sparse check matrix 202, is specified. In block 604, the number of global sites is specified. As discussed above, global sites may comprise data centers that are co-located or in different rooms, buildings, cities, states, or countries, etc.

In block 606, in an example, the correlation number of each data node associated with exclusive nodes in other sites is specified. The flow of FIG. 6 may then return to block 502 of FIG. 5.

Figure 7:
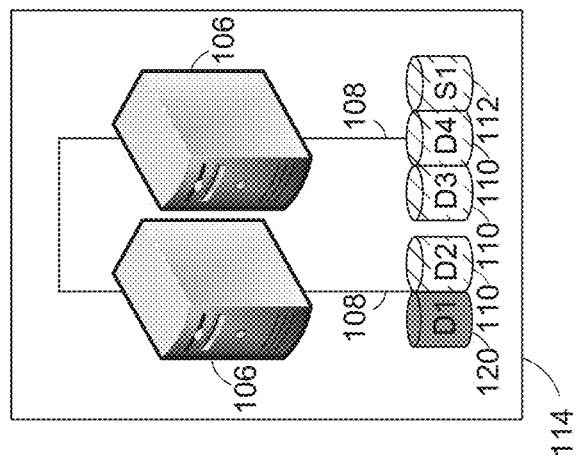
FIG. 7 illustrates a block diagram of a distributed data storage system with a single point of failure, according to an example of the present disclosure.

FIG. 7 illustrates a block diagram of a distributed data storage system with a single point of failure, according to an example of the present disclosure. In the example of FIG. 7, node D1 of server 106 in data center 114 has failed and is represented by failed node D1 (120).

Figure 8:
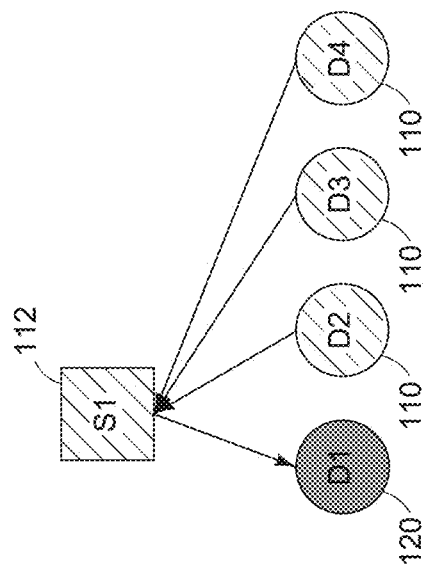
FIG. 8 illustrates correlations between data elements and a syndrome in a data matrix with a single point of failure, according to an example of the present disclosure.

FIG. 8 illustrates correlations between data elements and a syndrome in a data matrix with a single point of failure, according to an example of the present disclosure. In the example, as discussed above with respect to block 410 of FIG. 4, after a single failure has been detected, the failed node, e.g., D1 (120) is recovered by accessing the sparse check matrix 202, determining a correlated syndrome for the failed node, e.g., S1 (112), and recovering the single failure from within the same data center through, e.g, a recursive process as described in the example of FIG. 9.

Figure 9:
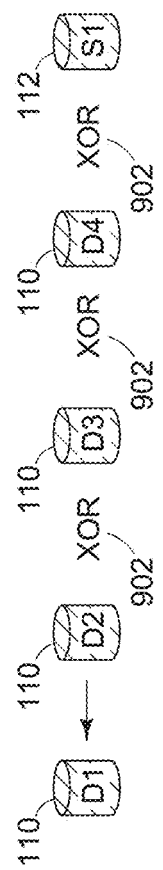
FIG. 9 illustrates a block diagram of a recovery in a distributed data storage system with a single point of failure, according to an example of the present disclosure.

FIG. 9 illustrates a block diagram of a recovery in a distributed data storage system with a single point of failure, according to an example of the present disclosure. Logical operations 902, such as an XOR operator, may be performed or used to recover the failed node, e.g., D1 (110/120), from a correlated syndrome, e.g., S1 (112) and correlated data elements D4, D3, and D2 (110). In other examples, other computing algorithms and recovery methods may be used in place of, e.g., an XOR operator.

Figure 10:
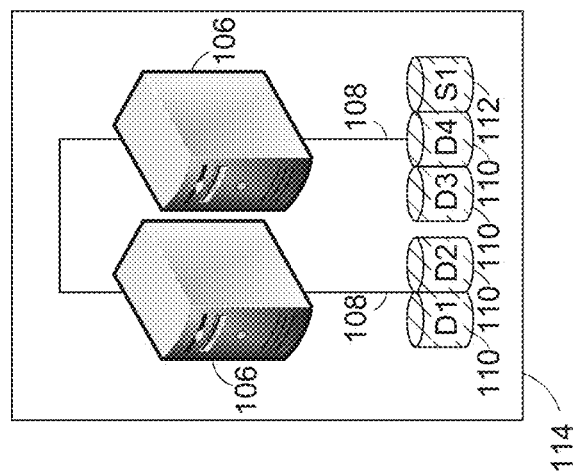
FIG. 10 illustrates a block diagram of a distributed data storage system with a single point of failure after data recovery, according to an example of the present disclosure.

FIG. 10 illustrates a block diagram of a distributed data storage system with a single point of failure after data recovery, according to an example of the present disclosure. In the example of FIG. 10, D1 (110) has been recovered and no longer appears as failed node D1 (120), as shown in FIG. 7.

Figure 11:
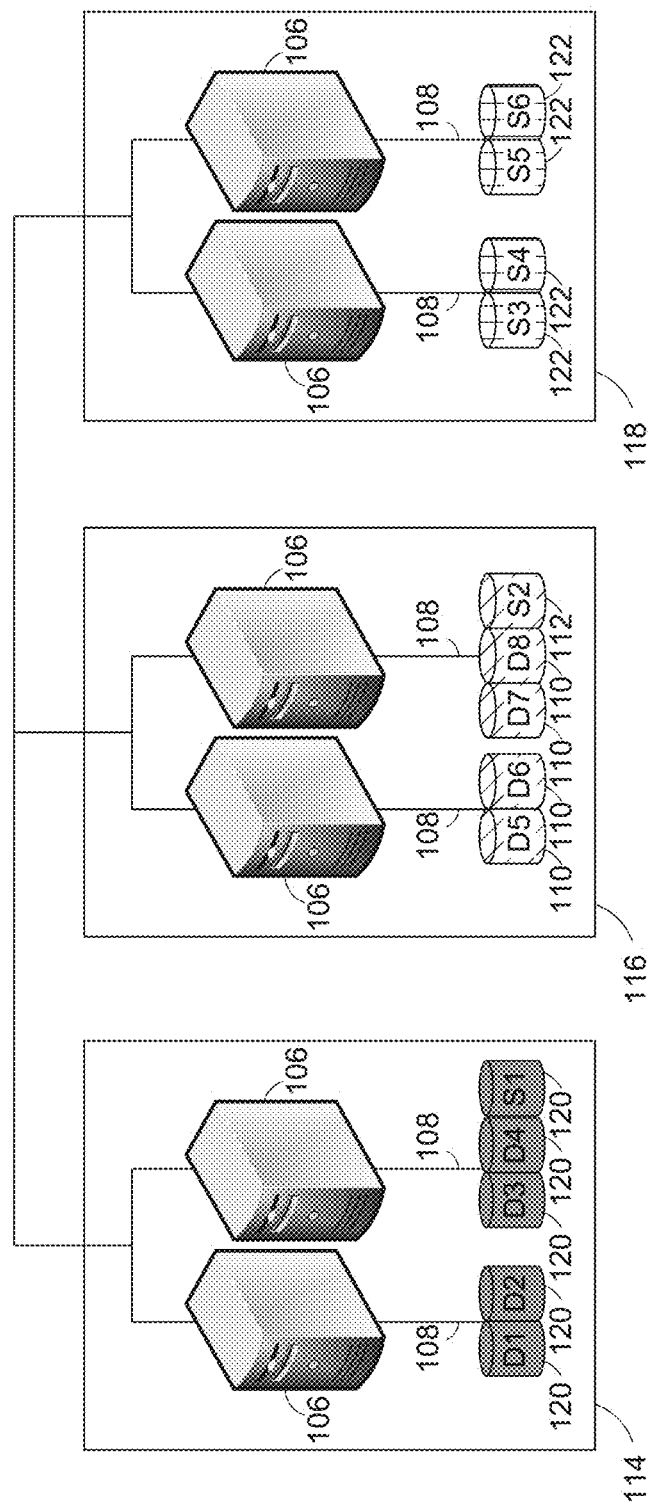
FIG. 11 illustrates a block diagram of a distributed data storage system with multiple points of failure, according to an example of the present disclosure.

FIG. 11 illustrates a block diagram of a distributed data storage system with multiple points of failure, according to an example of the present disclosure. In the example of FIG. 1, nodes D1-D4 (110) and syndrome S1 (112) of server 106 in data center 114 have failed and are now failed nodes D1-D4 (120) and S1 (122). In the example of FIG. 11, data center 114 may be considered a site disaster.

Figure 12:
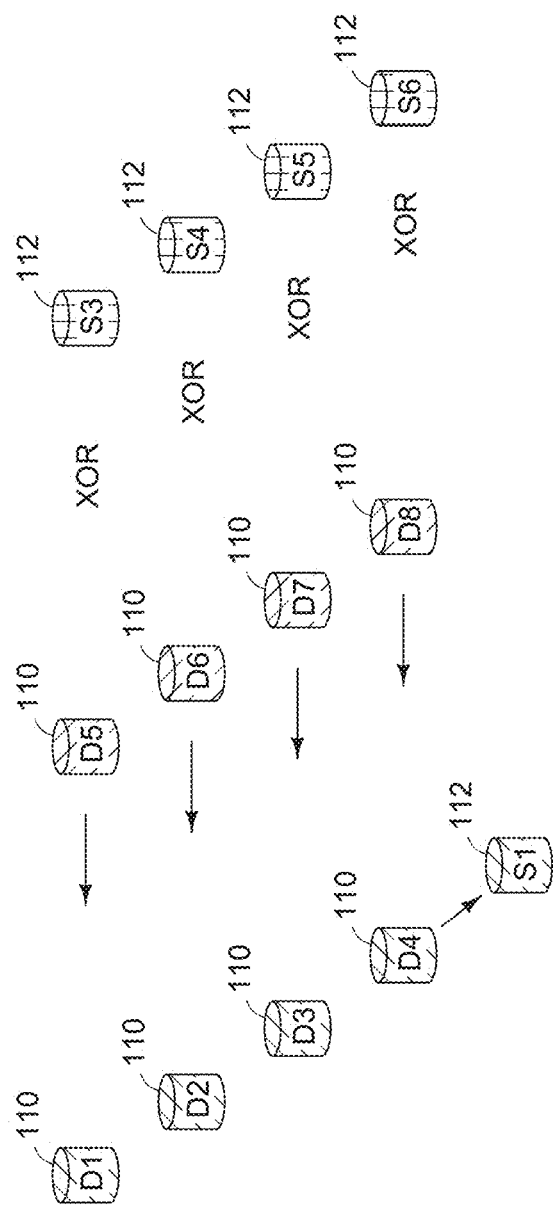
FIG. 12 illustrates a block diagram of a recovery in a distributed data storage system with multiple points of failure, according to an example of the present disclosure.

FIG. 12 illustrates a block diagram of a recovery in distributed data storage system 100 with multiple points of failure, according to an example of the present disclosure. In some examples, logical operations 902, such as an XOR operator, may be used to recover the failed nodes. In other examples, other computing algorithms and recovery methods may be used in place of, e.g., an XOR operator.

More specifically, as described above in more detail with respect to block 510 of FIG. 5, after a failure of more than one node has been detected, in an example, the failed nodes are recovered by accessing the sparse check matrix 202, determining correlated syndromes for the failed nodes across other geographical locations, e.g, data centers 114, 116, and 118, and recovering the failures globally through, e.g., a recursive process.

In one example, as shown in FIG. 12 wherein data center 114 is considered a site disaster, sparse check matrix 202 may be accessed to determine that syndrome S3 is correlated to data elements D1 and D5, as shown in FIGS. 2 and 3, allowing for recovery of D1 as shown in FIG. 12.

Figure 13:
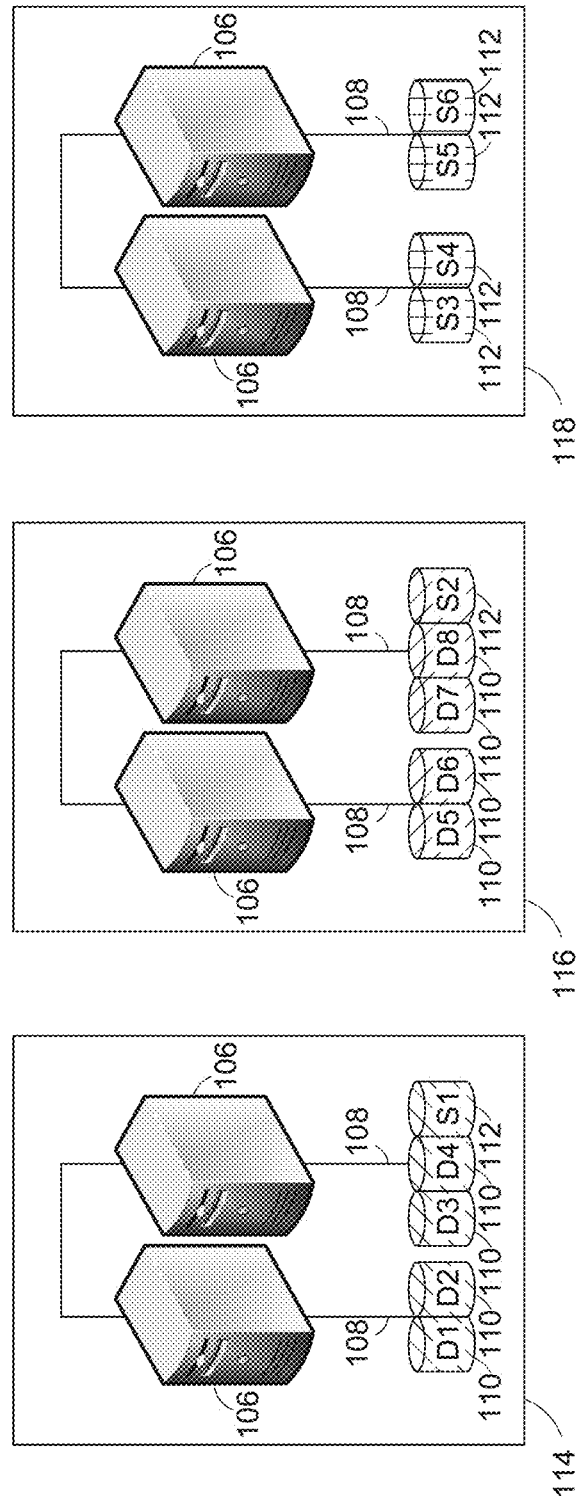
FIG. 13 illustrates a block diagram of a distributed data storage system with multiple points of failure after data recovery, according to an example of the present disclosure.

FIG. 13 illustrates a block diagram of a distributed data storage system with multiple points of failure after data recovery, according to an example of the present disclosure. In the example of FIG. 13, D1-D4 (110) and S1 (112) have been recovered and no longer appear as failed nodes D1-D4 (120) and S1 (122), as shown in FIG. 11.

It will be understood that the systems and methods described herein may also recover from the failure of more than one node, data center, or fault zone. In various examples utilizing different levels of protection schemes or virtualization technologies, e.g., RAID6, the sparse check matrix may be increased in size to reflect the protection scheme utilized and allow for recovery of more than one node, data center, or fault zone. In various examples, varying RAID levels and varying sparse check matrix sizes may recover from, e.g., 2 out of 3 nodes failing, 5 out of 10 data centers failing, or other examples of failure in a distributed data storage system.

Figure 14:
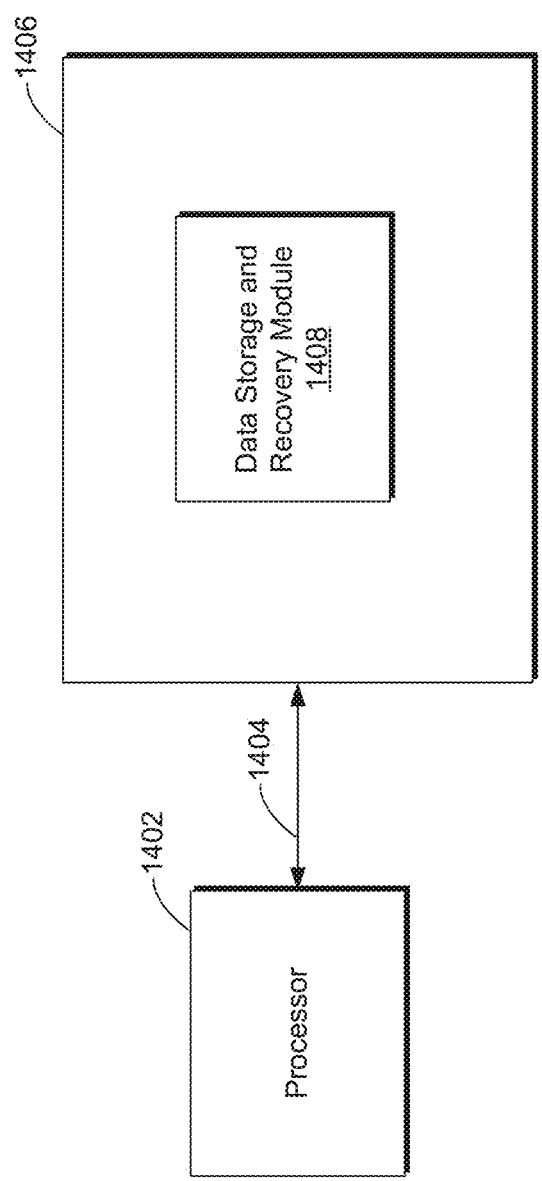
FIG. 14 is an example block diagram showing a non-transitory, computer-readable medium that stores code for operating computers such as computers 102 and 106 of FIG. 1, according to an example of the present disclosure.

FIG. 14 is an example block diagram showing a non-transitory, computer-readable medium that stores code for operating computers such as computers 102 and 106 of FIG. 1, according to an example of the present disclosure.

In one example, the distributed data storage system 100 comprises one or more program instructions stored on a non-transitory computer-readable medium 1406 which are executed by a processor 1402 in, for example, computer 102 or servers 106 of FIG. 1, or other computers and/or servers within, e.g., a distributed data storage system. The program instructions may be loaded onto computer 102 or servers 106 from computer-readable media such as a DVD, memory card, Flash memory device, or any other type of memory device or computer-readable medium that interfaces with the computer 102 or servers 106. In another example, the instructions may be downloaded onto computer 102 or servers 106 from an external device or network resource.

The non-transitory, computer-readable medium is generally referred to by the reference number 1406 and may include the modules described herein and in relation to FIGS. 1-13 relating to data storage and recovery processing. The on-transitory, computer-readable medium 1406 may correspond to any storage device that stores computer-implemented instructions, such as programming code or the like. For example, the non-transitory, computer-readable medium 1406 may include one or more of a non-volatile memory, a volatile memory, and/or one or more storage devices. Examples of non-volatile memory include, but are not limited to, electrically erasable programmable read only memory (EEPROM) and read only memory (ROM). Examples of volatile memory include, but are not limited to, static random access memory (SRAM), and dynamic random access memory (DRAM). Examples of storage devices include, but are not limited to, hard disk drives, solid state drives, compact disc drives, digital versatile disc drives, optical drives, and flash memory devices.

A processor 1402 generally retrieves and executes the instructions stored in the non-transitory, computer-readable medium 1406 to operate the computers in accordance with an example. In an example, the machine-readable medium 1406 may be accessed by the processor 1402 over a bus 1404. A region 1406 of the non-transitory, computer-readable medium 1406 may include the disk storage and recovery functionality, e.g., module or modules 1408, as described herein.

What has been described and illustrated herein are various examples of the present disclosure along with some of their variations. The terms, descriptions and figures used herein are set forth by way of illustration only and are not meant as limitations. Many variations are possible within the spirit and scope of the present disclosure, wherein the present disclosure is intended to be defined by the following claims, and their equivalents, in which all terms are meant in their broadest reasonable sense unless otherwise indicated.

What is claimed is:

1. A method of processing data in a distributed data storage system, comprising:
generating a sparse check matrix specifying correlations between data elements stored in the distributed data storage system and syndromes, wherein, for each of the syndromes, the respective syndrome is correlated with a partial subset of the data elements, the partial subset comprising those of the data elements that were used to generate the respective syndrome;
in response to receiving notification of a failed node in the distributed data storage system:
accessing the sparse check matrix;
identifying from the sparse check matrix one of the syndromes with which a first data element on the failed node is correlated;
identifying from the sparse check matrix a second data element that is correlated with the identified syndrome;
recovering the first data element by performing a logical operation on the second data element and the identified syndrome.

2. The method according to claim 1,
wherein the second data element, the first data element, and the identified syndrome are stored within a given fault zone, and
the method further comprising locally reconstructing the failed node at the given fault zone.

3. The method according to claim 1, wherein the second data element and the first data element are stored within different fault zones.

4. The method according to claim 1, wherein the second data element and the first data element are stored at different geographical locations.

5. The method according to claim 1, wherein generating the sparse check matrix comprises calling a progressive edge growth algorithm.

6. The method according to claim 1, wherein the sparse check matrix comprises a permutated sparse check matrix.

7. The method according to claim 1, wherein the sparse check matrix comprises a transformed sparse check matrix.

8. The method according to claim 1, wherein the sparse check matrix comprises a non-binary sparse check matrix.

9. The method according to claim 1, wherein the logical operation is an XOR operator.

10. A computer system comprising:
a processor;
a non-transitory storage medium; and
disk management instructions stored in the non-transitory storage medium that are to,
when executed by the processor, cause the processor to:
generate a sparse check matrix specifying correlations between data elements stored in a plurality of storage devices and syndromes, wherein, for each of the syndromes, the respective syndrome is correlated with a partial subset of the data elements, the partial subset comprising those of the data elements that were used to generate the respective syndrome; and
in response to one of the plurality of storage devices failing:
identify from the sparse check matrix one of the syndromes to which a first data element on the failed storage device is correlated;
identify from the sparse check matrix a second data element that is correlated with the identified syndrome;
perform a logical operation on the second data element and the identified syndrome to recover the first data element.

11. The system according to claim 10,
wherein the data elements are stored in a plurality of fault zones,
the second data element and the first data element are stored within a given fault zone of the plurality of fault zones, and
the instructions are to cause the processor to recover the failed node by locally reconstructing the failed node at the given fault zone.

12. The system according to claim 10, wherein the data elements are stored in a plurality of fault zones, and
the second data element and the first data element are stored within different ones of the plurality of fault zones.

13. The system according to claim 10, wherein the second data element and the first data element are stored at different geographical locations.

14. The system according to claim 10, wherein the instructions are to cause the processor to generate the sparse check matrix by calling a progressive edge growth algorithm.

15. The system of claim 10,
wherein, for each of the syndromes, at least half of the data elements are not correlated with the respective syndrome in the spare check matrix.

16. The system of claim 10,
wherein the data elements are stored in a plurality of first fault zones, and
wherein the sparse check matrix specifies correlations for:
first syndromes that correspond respectively to the first fault zones, and
second syndromes that each are correlated with two of the data elements,
wherein each of the first syndromes is stored in its corresponding first fault zone and is correlated with each of the data elements that is stored in its corresponding first fault zone; and
wherein, for each of the second syndromes, the respective second syndrome and each of the data elements correlated with it are stored in different fault zones.

17. The system of claim 16,
wherein, for each of the first syndromes, the respective first syndrome is not correlated to any of the data elements that are not stored in the corresponding first fault zone.

18. The system of claim 16,
wherein, for each of the second syndromes, the respective second syndrome is stored in a second fault zone that does not store any of the data elements.

19. The system of claim 16,
wherein for each of the second syndromes, the respective second syndrome is correlated to exactly two of the data elements.

20. A non-transitory computer readable storage medium that stores a computer program for processing data in a distributed data storage system, said computer program comprising a set of instructions to:
generate a sparse check matrix specifying correlations between data elements stored in a plurality of storage devices and syndromes, wherein, for each of the syndromes, the respective syndrome is correlated with a partial subset of the data elements, the partial subset comprising those of the data elements that were used to generate the respective syndrome; and in response to one of the plurality of storage devices failing:
  identify from the sparse check matrix one of the syndromes with which a first data element on the failed storage device is correlated;
  identify from the sparse check matrix a second data element that is correlated with the identified syndrome;
  perform a logical operation on the second data element and the identified syndrome to recover the first data element.

* * * * *